United States Patent
Cabral, Jr. et al.

(10) Patent No.: US 7,173,312 B2
(45) Date of Patent: Feb. 6, 2007

(54) STRUCTURE AND METHOD TO GENERATE LOCAL MECHANICAL GATE STRESS FOR MOSFET CHANNEL MOBILITY MODIFICATION

(75) Inventors: Cyril Cabral, Jr., Mahopac, NY (US); Bruce B. Doris, Hopewell Junction, NY (US); Thomas S. Kanarsky, Hopewell Junction, NY (US); Xiao H. Liu, Croton-on-Hudson, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,101

(22) Filed: Dec. 15, 2004

(65) Prior Publication Data

US 2006/0124974 A1    Jun. 15, 2006

(51) Int. Cl.
*H01L 29/76* (2006.01)

(52) U.S. Cl. ............... 257/369; 257/388; 257/384; 257/383; 257/382; 257/754; 257/757

(58) Field of Classification Search ............... 257/388, 257/369
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |

(Continued)

*Primary Examiner*—Kenneth Parker
*Assistant Examiner*—José R. Diaz
(74) *Attorney, Agent, or Firm*—Scully, Scott, Murphy & Presser, P.C.; Joseph P. Abate, Esq.

(57) ABSTRACT

A semiconductor structure and method that is capable of generating a local mechanical gate stress for channel mobility modification are provided. The semiconductor structure includes at least one NFET and at least one PFET on a surface of a semiconductor substrate. The at least one NFET has a gate stack structure comprising a gate dielectric, a first gate electrode layer, a barrier layer, a Si-containing second gate electrode layer and a compressive metal, and the at least one PFET has a gate stack structure comprising a gate dielectric, a first gate electrode layer, a barrier layer and a tensile metal or a silicide.

11 Claims, 12 Drawing Sheets

U.S. PATENT DOCUMENTS

| | | | |
|---|---|---|---|
| 5,679,965 A | 10/1997 | Schetzina | |
| 5,818,092 A * | 10/1998 | Bai et al. | 257/388 |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,977,194 B2 * | 12/2005 | Belyansky et al. | 438/197 |
| 7,053,400 B2 * | 5/2006 | Sun et al. | 257/19 |
| 2001/0009784 A1 | 7/2001 | Ma et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2003/0151098 A1 * | 8/2003 | Nishida et al. | 257/369 |
| 2005/0051855 A1 * | 3/2005 | Kanegae et al. | 257/410 |
| 2005/0145950 A1 * | 7/2005 | Chidambarrao et al. | 257/369 |
| 2005/0214998 A1 * | 9/2005 | Chen et al. | 438/199 |
| 2005/0282325 A1 * | 12/2005 | Belyansky et al. | 438/199 |
| 2006/0057787 A1 * | 3/2006 | Doris et al. | 438/153 |

* cited by examiner

STRUCTURE AND METHOD TO GENERATE LOCAL MECHANICAL GATE STRESS FOR MOSFET CHANNEL MOBILITY MODIFICATION

FIELD OF THE INVENTION

The present invention relates to high performance metal oxide semiconductor field effect transistors (MOSFETs) for use in analog or digital applications, and more particularly to MOSFETs in which a local mechanical gate stress is present that modifies the channel mobility. The present invention also relates to a method to generate local mechanical gate stress for MOSFET channel mobility modification.

BACKGROUND OF THE INVENTION

Improvements in transport properties, i.e., carrier mobility, through strain have been demonstrated in the operating characteristics of field effect transistors (FETs). For complementary metal oxide semiconductor (CMOS) devices, an improvement in device characteristics through enhanced carrier mobility has significant potential for the fabrication of very high-speed devices. Strained silicon on a relaxed SiGe substrate is one system where such an improvement occurs, see, for example, D. K. Nayak, et al., "High Mobility p-Channel Metal-Oxide-Semiconductor Field-Effect-Transistor on Strained Si," Appl. Phys. Lett., 62 (22), p. 2853–2855 (1993).

Experimental research on enhanced carrier mobility MOSFETs caused by strain has concentrated on a strained Si layer grown on a relaxed SiGe substrate. MOSFET's fabricated using the Si/SiGe system exhibit the following disadvantages:

(1) High source and drain junction leakage—the FET source and drain junctions, as well as the channel region, are formed in a strained Si area resulting in high junction leakage.

(2) The Si/SiGe system MOSFET process is not compatible with mainstream CMOS fabrication techniques requiring specially prepared substrates using molecular beam epitaxy.

(3) The Si/SiGe system MOSFET process is costly with a low production rate.

Local mechanical stress (LMS) is a viable alternative to strained Si by SiGe. The most common LMS approach is to use a stressed SiN contact etch stop to generate channel strain to enhance charge carrier mobility. Channel stain may also be produced by applying stress from the gate electrode.

It is known that silicides commonly used in semiconductor processing can have a high tensile stress. However, in order to have a significant influence on the channel, the silicide must be in close proximity to the surface of the channel. By "close proximity", it is meant that the silicide must be within about 10 nm or less from the surface of the channel. In addition, the thickness of the silicide must be uniform if there is to be uniform channel strain for all CMOS devices.

Two of the main challenges for generating gate stress by silicides are to have a uniform silicide that is in close proximity to the channel. Thus, the need exists for a structure that is capable of minimizing the distance of the silicide to the channel within the gate stack with a high degree of uniformity and control. In other words, there is a need for providing a semiconductor structure that can generate a local mechanical stress for MOSFET channel mobility enhancement.

SUMMARY OF THE INVENTION

The present invention provides a structure and method that is capable of generating a local mechanical gate stress that modifies channel mobility of a MOSFET. In particular, there is a need for providing a structure that has local mechanical stress generated for NFETs and local mechanical stress generated for PFETs.

In broad terms, the present invention provides a semiconductor structure comprising at least one NFET and at least one PFET on a surface of a semiconductor substrate, wherein said at least one NFET has a gate stack structure comprising a gate dielectric, a first gate electrode layer, a barrier layer, and a compressive metal; and said at least one PFET has a gate stack structure comprising a gate dielectric, a first gate electrode layer, a barrier layer and a tensile metal or a Si-containing second gate electrode layer and a silicide. The tensile metal or silicide produces local mechanical stress in the channel of the PFET device that enhances the carrier mobility of that device, while the compressive metal produces local mechanical stress for the NFET.

The present invention also provides methods for forming the above mentioned semiconductor structure. In accordance with a first method of the present invention, the inventive semiconductor structure is fabricated utilizing the following processing steps:

providing a semiconductor structure having layers of a gate dielectric, a first gate electrode layer, a barrier layer, a Si-containing second gate electrode layer and a hard mask located on a surface of a semiconductor substrate, said semiconductor substrate containing a trench isolation region;

patterning said layers to provide at least one patterned gate stack for a NFET and a least one patterned gate stack for a PFET, said NFET and PFET are separated by said trench isolation region;

forming at least one spacer on sidewalls of each patterned gate stack and forming silicided source/drain regions in said semiconductor substrate adjacent each patterned gate stack;

forming a planarized dielectric film that exposes a top surface of each patterned gate stack;

selectively forming a compressive metal in said at least one patterned gate stack for said NFET; and selectively forming a tensile metal or silicide in said at least one patterned gate stack for said PFET.

A second method of forming the inventive structure is also provided which includes the steps of:

providing a semiconductor structure having layers of a gate dielectric, a first gate electrode layer, a barrier layer, a second gate electrode layer and a hard mask located on a surface of a semiconductor substrate, said semiconductor substrate containing a trench isolation region and said second gate electrode layer comprising a tensile metal or a silicide;

patterning said layers to provide at least one patterned gate stack for a NFET and a least one patterned gate stack for a PFET, said NFET and PFET are separated by said trench isolation region;

forming at least one spacer on sidewalls of each patterned gate stack and forming silicided source/drain regions in said semiconductor substrate adjacent each patterned gate stack;

forming a planarized dielectric film that exposes a top surface of each patterned gate stack;

and selectively forming a compressive metal in said at least one patterned gate stack for said NFET.

DETAILED DESCRIPTION OF THE DRAWINGS

Figure 1A:
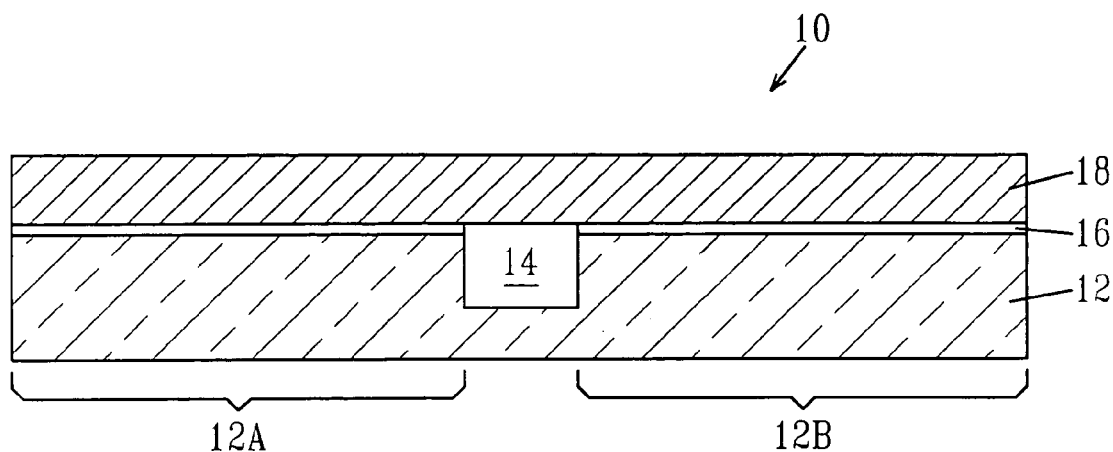
FIGS. 1A–1J are pictorial representations (through cross sectional views) illustrating basic processing steps of one embodiment of the present invention.
Figure 1B:
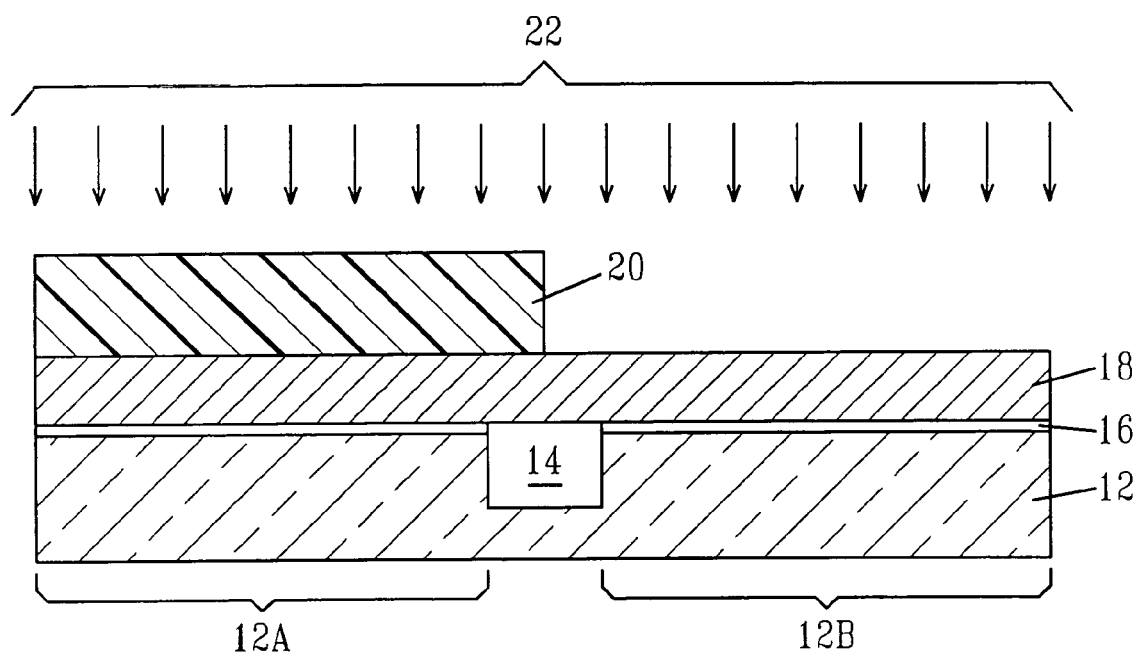
Figure 1C:
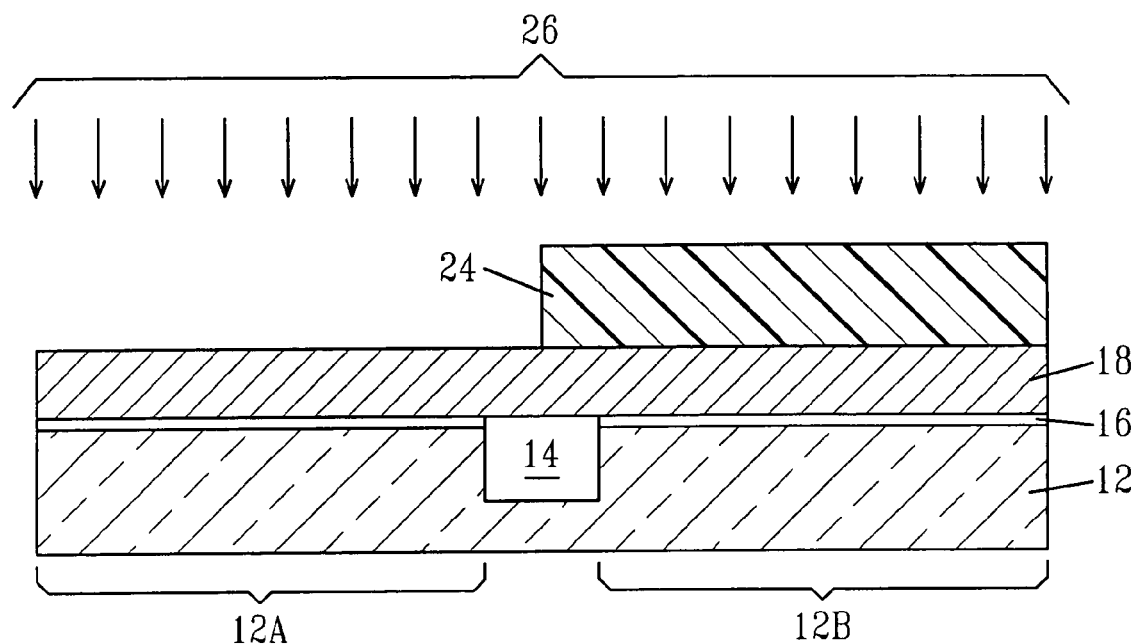

The present invention, which provides a semiconductor structure and method that is capable of generating local mechanical stress for channel mobility enhancement, will now be described in greater detail by referring to the following discussion and drawings. The drawings that accompany the present application are provided for illustrative purposes and thus the drawings are not drawn to scale.

Reference is first made to FIGS. 1A–1J which illustrates basic processing steps of one embodiment of the present invention for generating a local mechanical gate stress for MOSFET channel mobility modification. The process of this embodiment of the present invention begins by first providing the structure 10 shown in FIG. 1A. As illustrated, structure 10 includes a semiconductor substrate 12, at least one trench isolation region 14, a gate dielectric 16 and a first gate electrode layer 18.

The semiconductor substrate 12 of structure 10 comprises any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically labeled in the drawings of the present application. The first doped region and the second doped region may be the same, or they may have different conductivities and/or doping concentrations. These doped regions are known as "wells".

The at least one trench isolation region 14 is formed in the semiconductor substrate 12 utilizing conventional processes well known to those skilled in the art. The at least one trench isolation 14 is typically formed utilizing trench isolation techniques that are well known in the art including, for example, forming a patterned mask on the surface of the substrate via lithography, etching a trench into the substrate thru an opening in the patterned mask, filling the trench with a trench dielectric such as $SiO_2$ or TEOS and planarizing the structure. An optional trench liner can be formed within the trench prior to trench dielectric fill and an optional densification step may follow the planarization process.

The at least one trench isolation region 14, which separates the semiconductor substrate 12 into two regions, 12A and 12B such as shown in FIG. 1A, isolates semiconductor devices such as FET devices that are formed on the semiconductor substrate 12.

A gate dielectric 16 is formed on the entire surface of the structure 10 including the semiconductor substrate 12 and atop the isolation region, if it is present and, if it is a deposited dielectric. The embodiment illustrated in FIG. 1A shows the case in which the gate dielectric 16 is located only atop the semiconductor substrate 12. The gate dielectric 16 can be formed by a thermal growing process such as, for example, oxidation, nitridation or oxynitridation. Alternatively, the gate dielectric 16 can be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric 16 may also be formed utilizing any combination of the above processes.

The gate dielectric 16 is comprised of an insulating material including, but not limited to: an oxide, nitride, oxynitride and/or silicate including metal silicates and nitrided metal silicates. In one embodiment, it is preferred that the gate dielectric 16 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 16 may vary, but typically, the gate dielectric 16 has a thickness from about 0.5 to about 10 nm, with a thickness from about 0.5 to about 3 nm being more typical.

After forming the gate dielectric 16, a blanket layer of a first gate electrode material 18 is formed on the gate dielectric 16 utilizing a known deposition process such as, for example, physical vapor deposition, CVD or evaporation. The thickness, i.e., height, of the first gate electrode layer 18 deposited at this point of the present invention may vary depending on the deposition process employed. Typically, the first gate electrode layer 18 has a vertical thickness from about 5 to about 180 nm, with a thickness from about 5 to about 50 nm being more typical.

The first gate electrode layer 18 can comprise any conductive material that is typically employed as a gate of a CMOS structure. Illustrative examples of such conductive materials that can be employed as the first gate electrode layer 18 include, but are not limited to: polysilicon, conductive metals, conductive metal alloys, conductive silicides, conductive nitrides, polySiGe and combinations thereof, including multilayers thereof. In a preferred embodiment, the first gate electrode layer 18 is a layer of polysilicon.

A first block mask 20 is then formed on the structure 10 shown in FIG. 1A utilizing a conventional photolithography process. The first block mask 20 covers one of the regions 12A and 12B mentioned above and then ions of a first conductivity type 22 are implanted into the first gate electrode 18 that is not protected by the first block mask 20. The ions of the first conductivity type can be either an n-type dopant (i.e., an element from Group VA of the Periodic Table of Elements such as P, As, Sb or Bi) or a p-type dopant (i.e., an element from Group IIIA of the Periodic Table of Elements such as B, Al, Ga, In or Tl) depending on the type of CMOS device to be fabricated in the region that is not protected by the first block mask 20.

The doping of the first gate electrode layer 18 not protected by the first block mask 20 will shift the workfunction of the gate formed in the unprotected portion. Typical doses for the ion implants are 1E14 (=$1\times10^{14}$) to 1E16 (=$1\times10^{16}$) atoms/cm$^2$ or more typically 1E15 to 8E15 atoms/cm$^2$. The implant is typically performed at a low energy of about 2 to about 8 keV.

For illustrative purposes, the first block mask 20 covers portions of semiconductor substrate 12A in which at least one PFET will be formed, while leaving region 12B unprotected. See FIG. 1B. In this illustrated embodiment, the ions of the first conductivity type 22 are n-type dopants and the unprotected portion of the first gate electrode layer is thus doped with an n-type dopant. Hence, region 12B, in the illustrated embodiment, is the region in which at least one NFET is to be formed.

After implanting ions of a first conductivity type 22 into the region not protected with the first block mask 20, the first block mask 20 is removed utilizing a conventional resist stripping process such as, for example, an O$_2$ ash process.

A second block mask 24 is then formed on the structure 10 utilizing a conventional photolithography process. The second block mask 24 covers one of the regions 12A and 12B mentioned above that was not previously protected with the first block mask 20. Specifically, the second block mask 24 covers regions that received the ions of the first conductivity type. Ions of a second conductivity type 26 which differ from the ions of the first conductivity type 22 are implanted into the first gate electrode layer 18 that is not protected by the second block mask 24. The ions of the second conductivity type 26 can be either an n-type dopant (i.e., an element from Group VA of the Periodic Table of Elements such as P, As, Sb or Bi) or a p-type dopant (i.e., an element from Group IIIA of the Periodic Table of Elements such as B, Al, Ga, In or Tl) depending on the type of CMOS device to be fabricated in the region that is not protected by the second block mask 24, with the proviso that the ions of the second conductivity type 26 differ in conductivity than the ions of the first conductivity type 22.

The doping of the first gate electrode layer 18 not protected by the second block mask 24 will shift the workfunction of the gate formed in the unprotected portion. Typical doses for the ion implants are 1E14 (=$1\times10^{14}$) to 1E16 (=$1\times10^{16}$) atoms/cm$^2$ or more typically 1E15 to 5E15 atoms/cm$^2$. The implant is typically performed at a low energy of about 2 to about 8 keV.

For illustrative purposes, the second block mask 24 covers portions of semiconductor substrate 12B in which at least one NFET will be formed, while leaving region 12A unprotected. See FIG. 1C. In this illustrated embodiment, the ions of the second conductivity type 26 are p-type dopants and the unprotected portion of the first gate electrode layer 18 is thus doped with a p-type dopant. Hence, region 12A, in the illustrated embodiment, is the region in which at least one PFET is to be formed.

After implanting ions of a second conductivity type 26 into the region not protected with the second block mask 24, the second block mask 24 is removed utilizing a conventional resist stripping process such as, for example, an O$_2$ ash process.

Next, the structure including the predoped first gate electrode layer 18 is subjected to a thermal activation step that is capable of activating the dopant ions implanted into the first gate electrode layer 18. The thermal activation step may comprise an oven anneal, a rapid thermal anneal, a laser anneal or a spike anneal. Notwithstanding which of the anneal processes are used, the activation anneal is performed at a temperature that is typically greater than 900° C. In one embodiment, a rapid thermal anneal is used to activate the dopants and the anneal is performed at a temperature of about 1000° C. for a time period of less than 60 seconds.

A barrier layer 28 which serves as an etch stop is then formed atop the predoped first gate electrode layer 18. The barrier layer 28 is formed by a conventional deposition process such as, for example, CVD, PECVD, chemical solution deposition, and the like. The thickness of the barrier layer 28 may vary depending on the material as well as the method that was employed to deposit the same. Typically, the thickness of the as deposited barrier layer 28 is from about 5 to about 50 nm, with a thickness from about 5 to about 20 nm being even more typical.

The barrier layer 28 is comprised of a material that is resistant to oxygen and/or metal diffusion. Illustrative examples of materials for the barrier layer 28 include, but are not limited to: WN, TaN, TiN, TaSiN or combinations and multilayers thereof.

Next, a Si-containing second gate electrode layer 30 is formed atop the barrier layer 28. The Si-containing second gate electrode layer 30 is comprised of polySi, SiGe (including polySiGe), and combinations or multilayers thereof. The purpose of the Si-containing second gate electrode layer 30 is (1) to provide a portion of the gate stack that is removable after the gate stack etching process or (2) to form a silicide metal gate.

The thickness of the Si-containing second electrode layer 30 may vary; a typical thickness range for layer 30 is from about 20 to 150 nm, with a thickness range from about 40 to about 100 nm being even more typical. The Si-containing second electrode layer 30 is formed utilizing a deposition process such as that used in forming the first gate electrode layer 18.

A hard mask 32 comprised of, for example, a nitride or oxide, is then formed by a conventional deposition process such as CVD or PECVD on the Si-containing second electrode layer 30. Alternatively, hard mask 32 is formed by a thermal oxidation or nitridation process. In one embodiment, the hard mask 32 is preferably comprised of SiN. The thickness of the hard mask 32 is typically from about 10 to about 150 nm, with a thickness from about 30 to about 60 nm being even more typical.

Figure 1D:
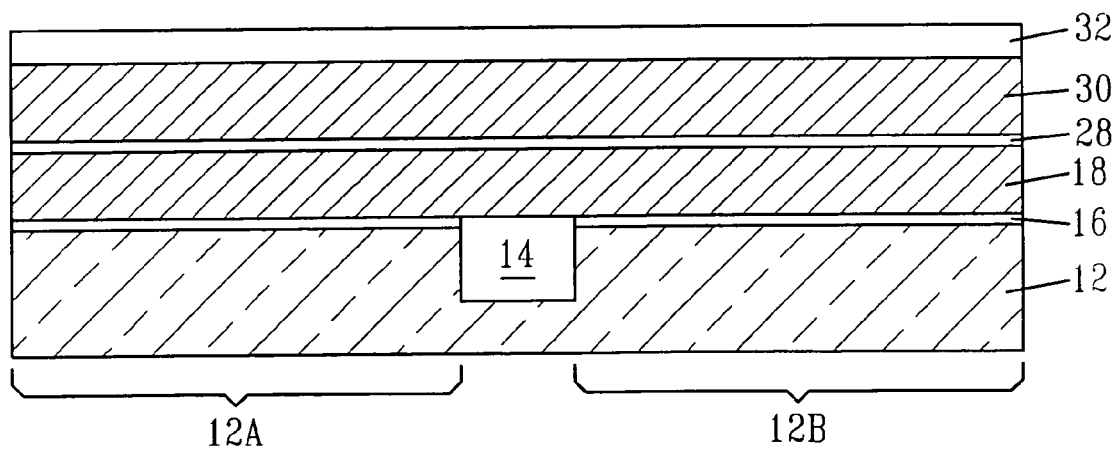

The structure including barrier layer 28, Si-containing second electrode layer 30 and the hard mask 32 is shown, for example, in FIG. 1D.

Next, a conventional lithography process (not specifically shown in the drawings) is used to pattern resist images over hard mask 32. A dry etching process such as reactive ion etching (RIE), ion beam etching, plasma etching or laser ablation is then used to transfer the pattern of the resist images into the various layers shown in FIG. 1D providing patterned gate stacks 34 and 36, respectively. In the specific embodiment illustrated in FIG. 1E, patterned gate stack 34 is for a PFET, while patterned gate stack 36 is for a NFET. The opposite gate stack configuration is also contemplated herein. Also, although only a single patterned gate stack is shown in both regions 12A and 12B, the present invention contemplates forming a plurality of such patterned gate stacks in each of the regions, as desired. In the drawings, the thickness of the first gate electrode layer 18 has been reduced for clarity and to emphasize what is occurring in the upper region of each patterned gate stack.

Figure 1E:
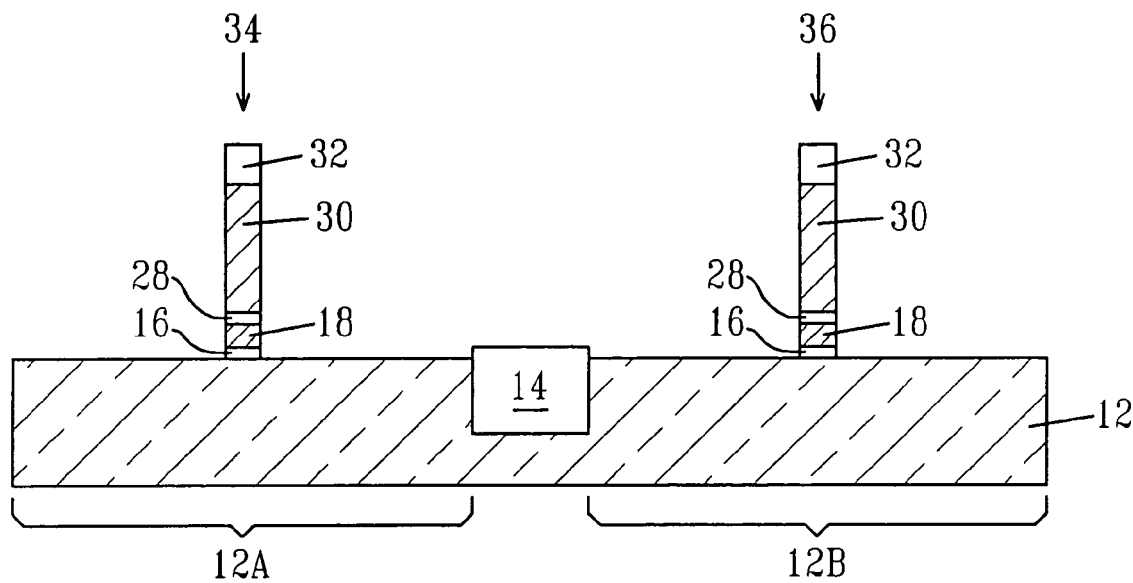
Figure 1F:
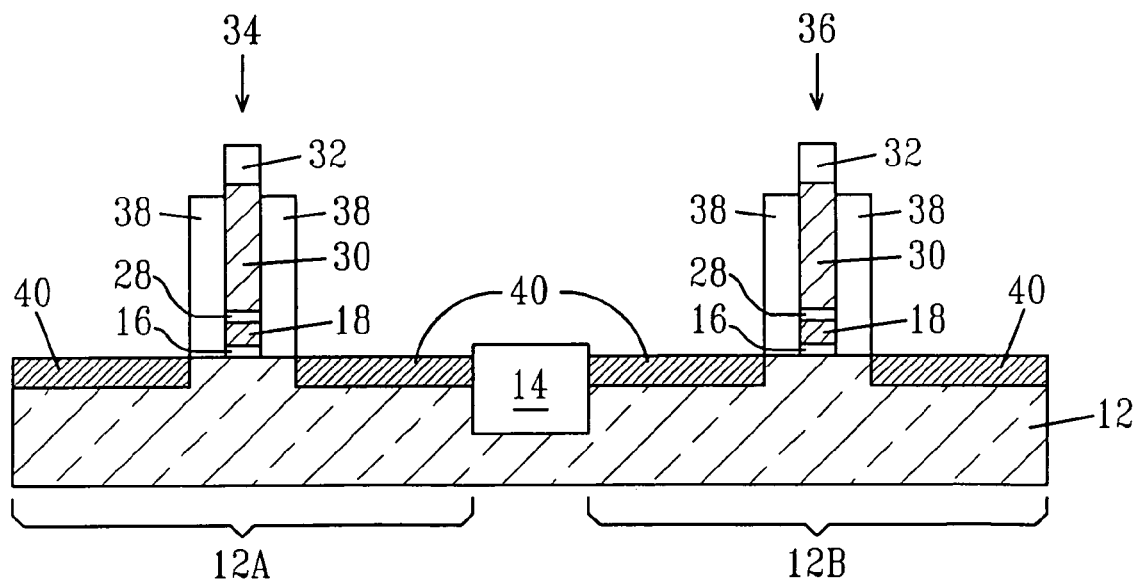

After providing the patterned gate stacks shown in FIG. 1E, standard processing known in the art of CMOS device fabrication is then used to provide the structure shown in FIG. 1F. Specifically, the standard CMOS device fabrication includes forming source/drain extension regions (not shown) via ion implantation. Next, at least one spacer 38 is formed on the sidewalls of each of the patterned gate stacks. The at least one spacer 38 is comprised of an insulating material such as an oxide, nitride, oxynitride or multilayers thereof. The width of the at least one spacer 38 must be sufficiently wide enough such that the source and drain silicide contacts (to be subsequently formed) do not encroach underneath the edges of each of the patterned gate stacks. Typically, the source/drain silicide does not encroach underneath the edges of the patterned gate stacks when the at least one spacer 38 has a width, as measured at the bottom, from about 15 to about 80 nm.

After spacer formation, source/drain diffusion regions (not specifically shown) are formed into the substrate 12. The source/drain diffusion regions are formed utilizing ion implantation and an annealing step. The annealing step serves to activate the dopants that were implanted by the previous implant step. The conditions for the ion implantation and annealing are well known to those skilled in the art.

In some embodiments of the present invention and when the substrate does not include silicon, a Si-containing layer can be formed atop of the exposed portions of the substrate to provide a source for forming the silicide contacts. Illustrative examples of Si-containing materials that can be used include, for example, Si, single crystal Si, polycrystalline Si, SiGe, and amorphous Si. This embodiment of the present invention is not illustrated in the drawings.

Next, the source/drain diffusion regions are silicided utilizing a standard salicidation process well known in the art to form silicided source/drain contacts 40. This includes forming a metal capable of reacting with Si atop the entire structure, forming an oxygen barrier layer atop the metal, heating the structure to form a silicide, removing non-reacted metal and, if needed, conducting a second heating step. The second heating step is required in those instances in which the first heating step does not form the lowest resistance phase of the silicide.

Figure 1G:
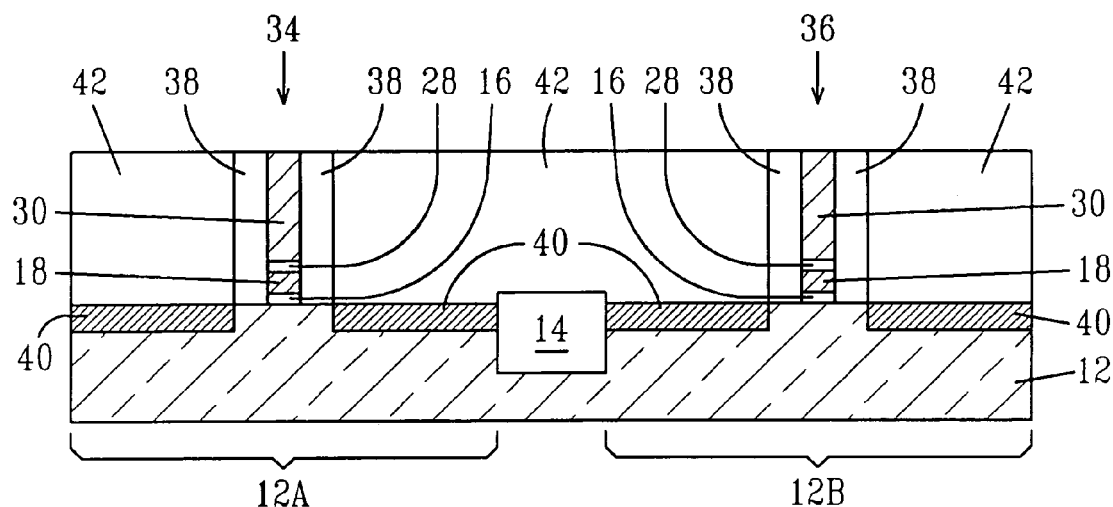
Figure 1H:
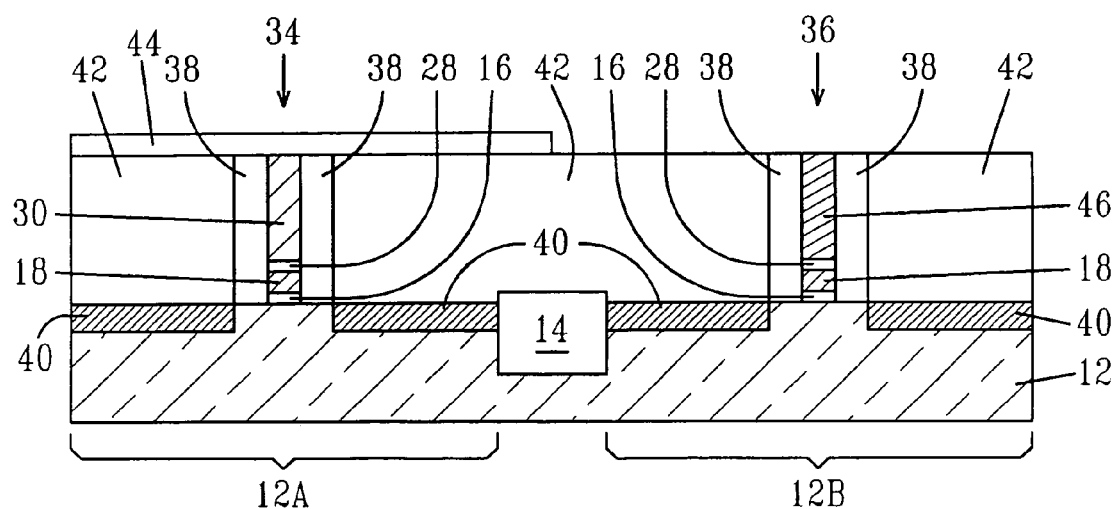

A dielectric film 42, which is comprised of a material that differs from hard mask 32 such as an oxide, is then formed over the structure shown in FIG. 1F by utilizing a deposition process such as high-density plasma deposition, and the dielectric film 42 is planarized to the top of each of the patterned gate stacks. The structure including the planarized dielectric film 42 is shown in FIG. 1G. The planarization step, which includes chemical mechanical polishing (CMP) or grinding, removes the hard mask 32 from atop of each of the patterned gate stacks. As a result, the planarized dielectric film 42 has a surface that is co-planar with the upper surface of the Si-containing second electrode layer 30.

A second hard mask 44 is then formed and patterned so as to cover the PFET gate stack. In the embodiment illustrated, the second hard mask 44 is formed atop the region 12A including gate stack 34. See, for example, the structure shown in FIG. 1H. The second hard mask 44 is comprised of a nitride such as SiN and it is formed by deposition, lithography and etching. The remaining portion of the structure, including the gate stack 36 for the NFET is not protected with the second hard mask 44.

The Si-containing second gate electrode 30 in the exposed region, e.g., region 12B in the illustrated embodiment, is then removed utilizing an etching process that selectively removes polySi or SiGe with respect to insulator, stopping on the barrier layer 28. Specifically, a wet chemical etching process in which a chemical etchant such as TMAH, KOH or HF/HNO$_3$ is used to remove the exposed Si-containing second gate electrode layer 30 in the NFET device region, e.g., region 12B.

A compressive metal 46 such as W, Ta, Mo, Nb, V Pt, Ru, Re, Rh or alloys thereof, is then deposited in the area previously occupied with the Si-containing second electrode layer 30 in the NFET gate stack on region 12B. The term "compressive metal" denotes any metal that is capable of providing a compressive strain to the underlying channel region. The compressive metal 46 is formed by a deposition process such as sputtering, CVD, PECVD, PVP, chemical solution deposition, metalorgano deposition and other like deposition processes. Following the deposition, the compressive metal 46 that extends beyond the upper surface of dielectric film 42 is removed via a planarization process providing the structure shown in FIG. 1H. The deposition parameters and subsequent anneal temperatures are crucial such that the compressive metal 46 retains its compressive state.

Figure 6:
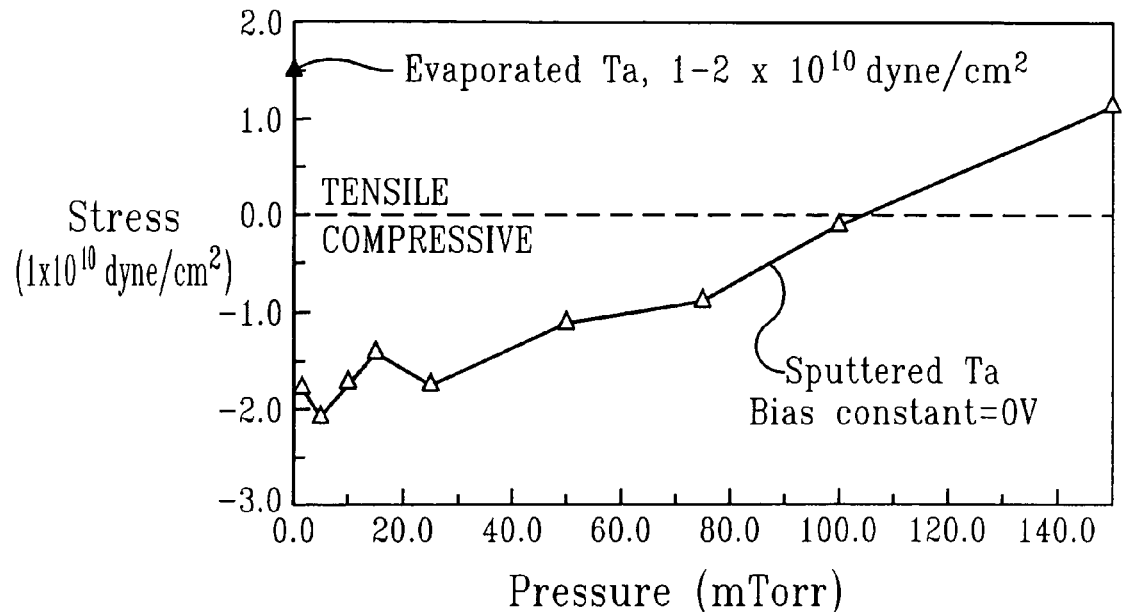
FIG. 6 is a prior art plot reproduced from J. Appl. Phys. 72(10), 4918 (1992) showing the stress in a Ta film as a function of deposition pressure.

As an example, a Ta film sputtered deposited at low pressure (<100 mTorr) and high bias (>0 V) can exhibit an as-deposited compressive stress up to 1–2 Gpa (See, FIG. 6). As long a subsequent processing does not entail temperatures higher than 600° C., the Ta film will remain in the compressive state.

Figure 1I:
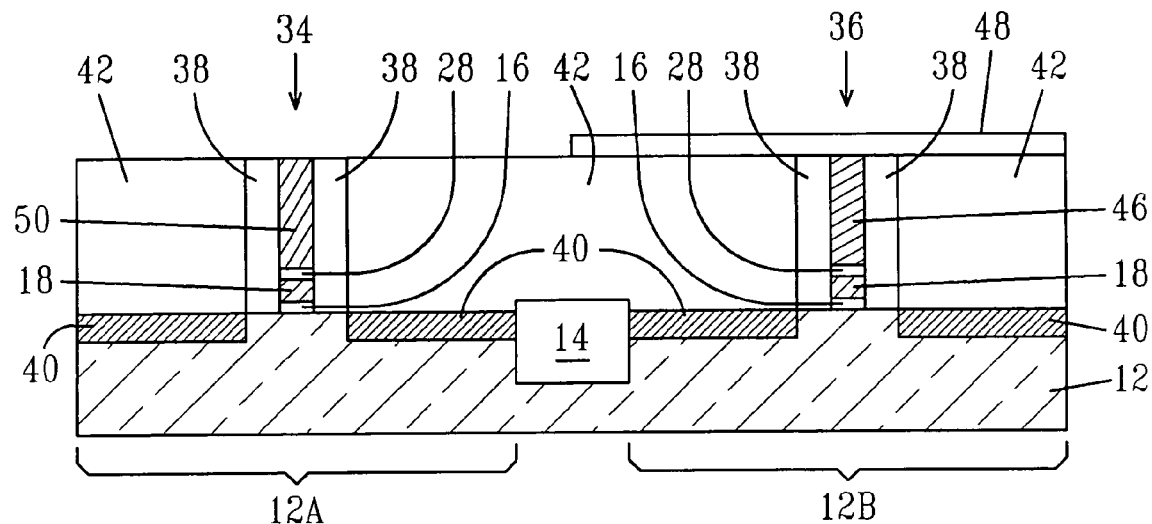

The entire second hard mask 44 is removed using a selective etching process. Next, and as shown in FIG. 1I, a third hard mask 48 is formed over the region including the previously formed compressive metal 46. In the embodiment illustrated, the region 12B including the patterned gate stack 36 is protected with the third hard mask 48, while the region 12A is left unprotected. The Si-containing second gate electrode 30 in the exposed region, e.g., region 12A in the illustrated embodiment, is then removed utilizing an etching process that selectively removes polySi or SiGe with respect to insulator, stopping on the barrier layer 28. Specifically, a wet chemical etching process in which a chemical etchant such as TMAH, KOH, HF/HNO$_3$ is used to remove the exposed Si-containing second gate electrode layer 30 in the PFET device region, e.g., region 12A.

A tensile metal 50 such as W, Ta, Mo, Nb, V, Pt, Ru, Re, Rh or alloys thereof, is then deposited in the area previously occupied with the Si-containing second electrode layer 30 in the PFET gate stack on region 12A. The term "tensile metal" denotes any metal that is capable of providing a tensile strain to the underlying channel region. The tensile metal 50 is formed by a deposition process such as sputtering, CVD, PECVD, PVP, chemical solution deposition, metalorgano deposition and other like deposition processes. Following the deposition, the tensile metal 50 that extends beyond the upper surface of dielectric film 42 is removed via a planarization process providing the structure shown in FIG. 1I.

As an example, a Ta film sputtered deposited at high pressure (>100 mTorr) and no bias (0 V) can exhibit an as-deposited tensile stress up to 1–2 GPa (See, FIG. 6). An evaporated Ta film will also exhibit a tensile stress. A Ta film sputtered deposited at low pressure (<100 mTorr) and high bias (>0 V) can exhibit an as-deposited compressive stress up to 1–2 GPa, which will become tensile upon annealing at temperatures higher than 750° C. (See FIG. 7).

Figure 1J:
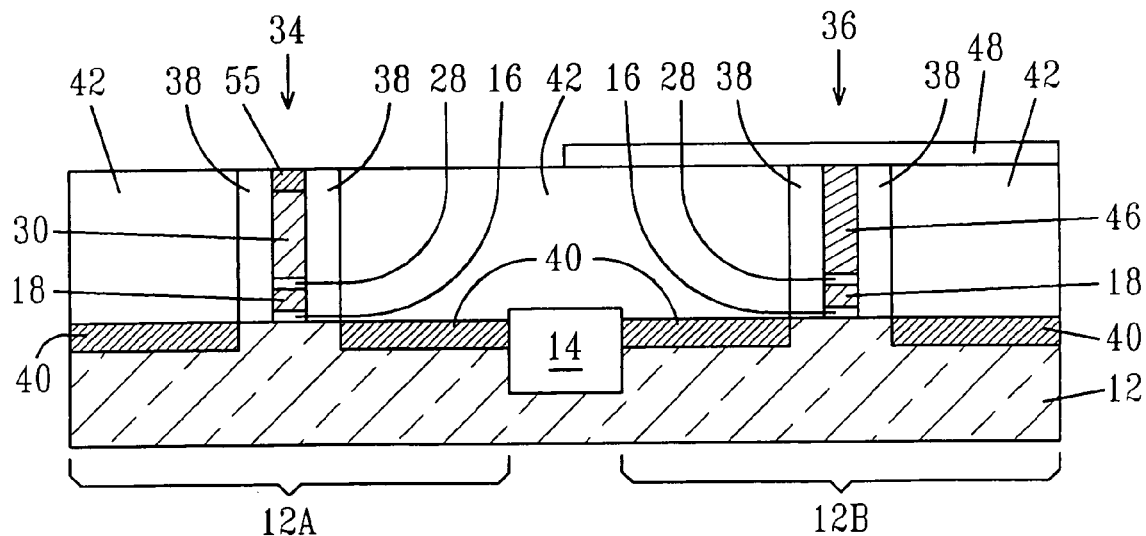

In another embodiment, a portion of the Si-containing second electrode 30 remains in the PFET region, e.g., 12A, and a silicide 55 is formed as shown in FIG. 1J. The silicide 55 is formed by a silicidation process which includes depositing a metal on an exposed surface of the structure including the patterned second hard mask 48, optionally depositing a capping layer, first annealing to form a silicide, selective etching any non-reacted metal including the capping layer if used and, if needed, performing a second annealing step.

The metal used in forming the silicide (or silicide contact) 55 in the upper surface of the Si-containing second gate electrode layer 30 comprises any metal that is capable of reacting with silicon to form a metal silicide. Examples of such metals include, but are not limited to: Ti, Ta, W, Co, Ni, Pt, Pd and alloys thereof. In one embodiment, Co is a preferred metal. In such an embodiment, the second annealing step is required. In another embodiment, Ni or Pt is preferred. In this embodiment, the second annealing step is typically not performed.

The metal may be deposited using any conventional deposition process including, for example, sputtering, chemical vapor deposition, evaporation, chemical solution deposition, plating and the like.

The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° to about 800° C. using a continuous heating regime or various ramp and soak heating cycles. More preferably, the second annealing step is performed at a temperature from about 650° to about 750° C. The second anneal typically converts the high resistance silicide into a silicide phase of lower resistance.

The silicide anneals are carried out in a gas atmosphere, e.g., He, Ar, $N_2$ or forming gas. The silicide contact annealing steps may use different atmospheres or the annealing steps may be carried out in the same atmosphere. For example, He may be used in both annealing steps, or He can be used in the first annealing step and a forming gas may be used in the second annealing step.

After this step has been performed, the third hard mask 48 is removed as described above, providing a structure similar to that shown in FIG. 1I except for the absence of the third hard mask 48.

The resultant structures shown in FIGS. 1I and 1J can then be subjected to BEOL (back-end-of-the-line) processing steps to form contact vias in the dielectric film 42 that extend to the silicided source/drain regions as well as the top of each of the patterned gate stacks.

The resultant semiconductor structure formed (see FIGS. 1I and 1J) thus comprises at least one NFET 36 and at least one PFET 34 on a surface of a semiconductor substrate 12, wherein said at least one NFET 36 has a gate stack structure comprising a gate dielectric 16, a first gate conductor layer 18, a barrier layer 28, and a compressive metal 46, and said at least one PFET 34 has a gate stack structure comprising a gate dielectric 16, a first gate electrode layer 18, a barrier layer 28 and a tensile metal 50 or a second Si-containing gate electrode layer 30 and a silicide 55. The tensile metal 50 or silicide 55 produces local mechanical stress in the channel of the PFET device which enhances the carrier mobility of that device, while the compressive metal 46 generates local mechanical stress in the channel of the NFET device.

Figure 2A:
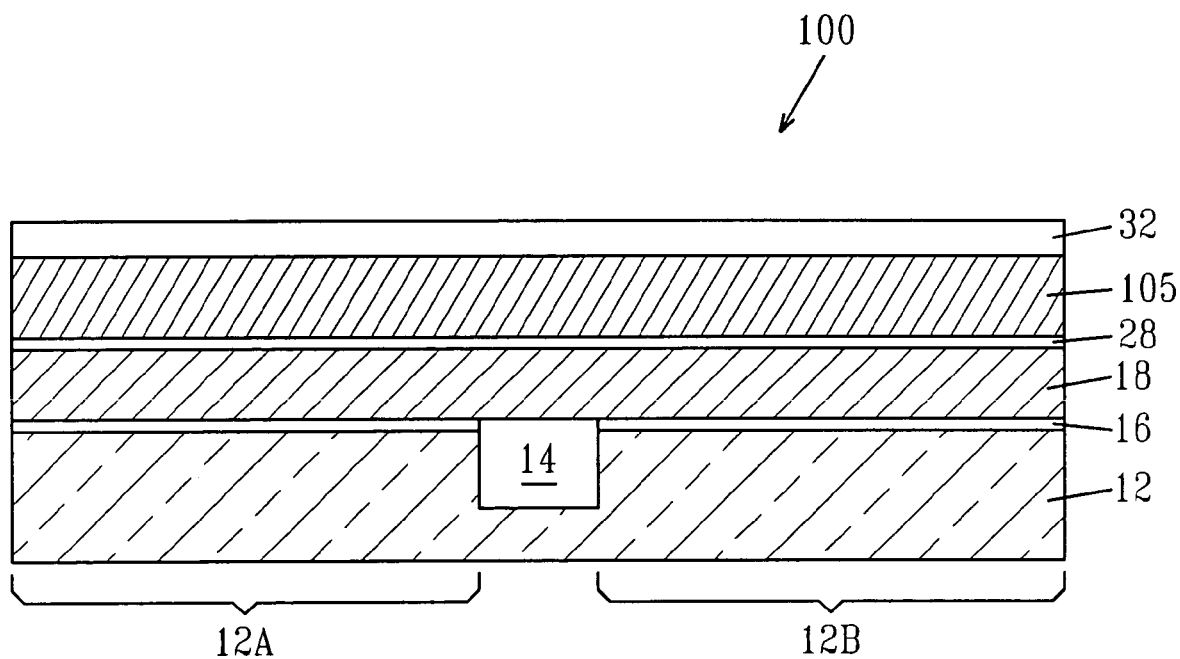
FIGS. 2A–2E are pictorial representations (through cross sectional views) illustrating basic processing steps of another embodiment of the present invention.

A second method of the present invention which is illustrated in FIGS. 2A–2E will now be described in greater detail. The second method of the present invention begins with providing the structure 100 shown in FIG. 2A. Structure 100 comprises a semiconductor substrate 12, at least one trench isolation region 14, a gate dielectric 16, a first gate electrode 18, a barrier layer 28, a second gate electrode layer 105, and a hard mask 32. The structure shown in FIG. 2A is made using the processing steps described above in the first method in forming the structure shown in FIG. 1D except that the second gate electrode layer 105 is comprised of a tensile metal or a silicide. The second gate electrode layer 105 is formed by a deposition process such as CVD, PECVD, sputtering and the like and the second gate electrode layer 105 typically has a thickness after deposition from about 20 to about 100 nm. The silicide is formed by a conventional silicidation process. The various implants into the first gate electrode 18 are not shown for clarity in this embodiment of the present invention. They, however, are performed so as to form the different regions 12A and 12B.

Figure 2B:
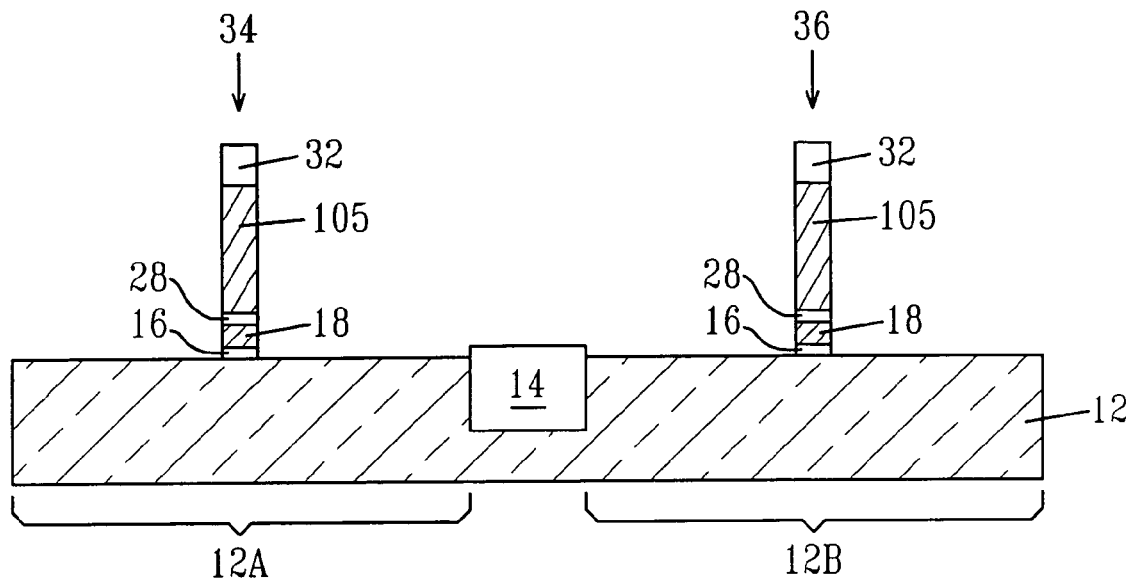

A resist (not shown) is then formed atop the structure shown in FIG. 2A by deposition and thereafter the resist is patterned by lithography. The resist pattern is then transferred to the underlying hard mask 32 by etching. After providing a patterned hard mask, the gate stack, including layers 16, 18, 28, and 105 are etched to form patterned gate stacks 34 and 36, respectively. The structure including the patterned gate stacks 34 and 36 is shown in FIG. 2B.

Figure 2C:
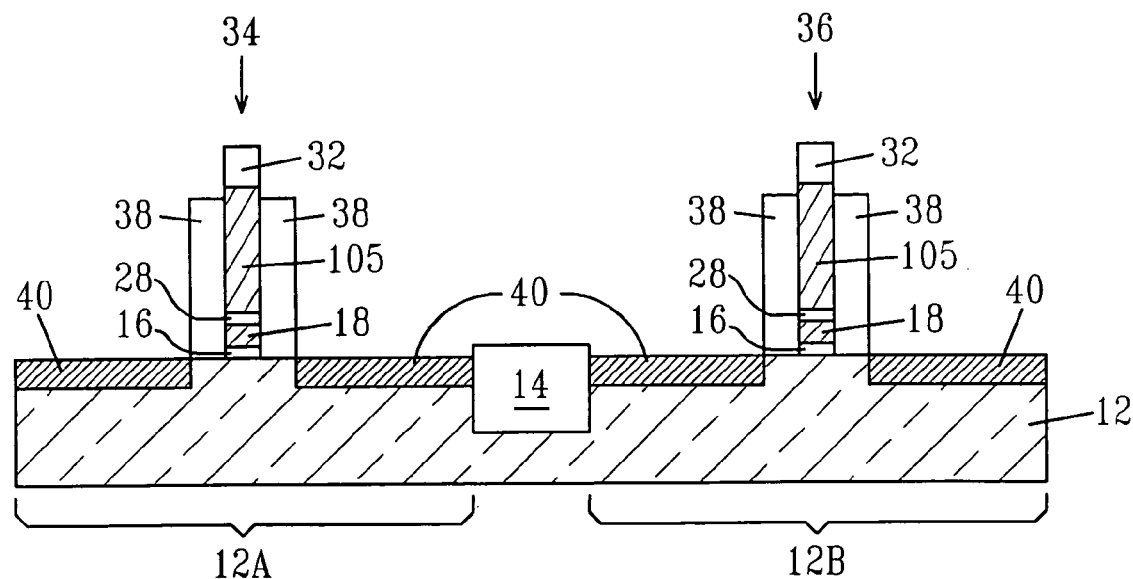

Next, standard processing as defined above in regard to fabricating the structure shown in FIG. 1F is performed to form the structure shown in FIG. 2C. The standard processing includes formation of at least one spacer 38, and formation of silicided source/drain contacts 40, as described above in the first method of the present invention.

Figure 2D:
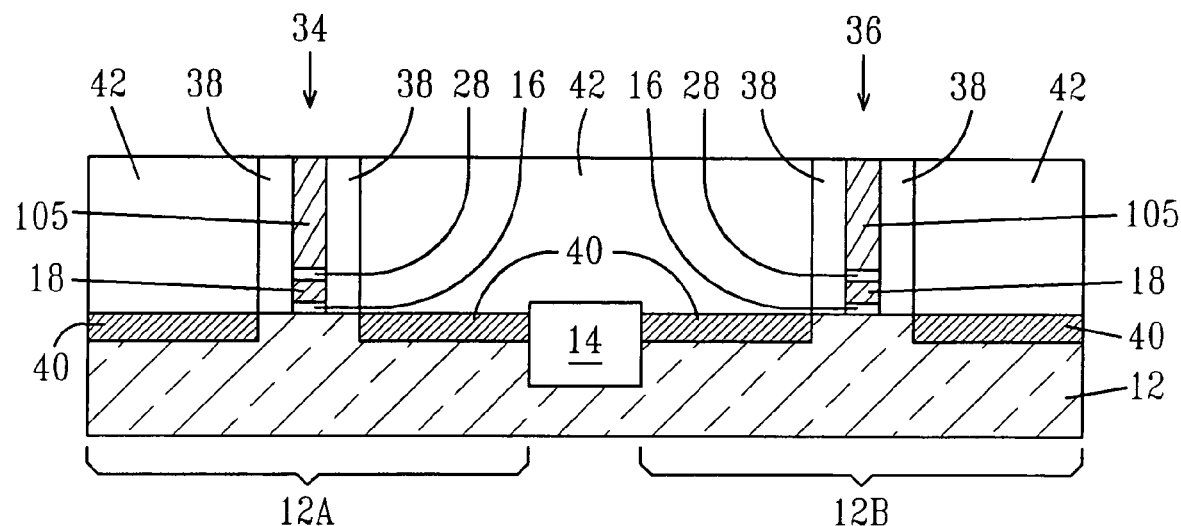
Figure 2E:
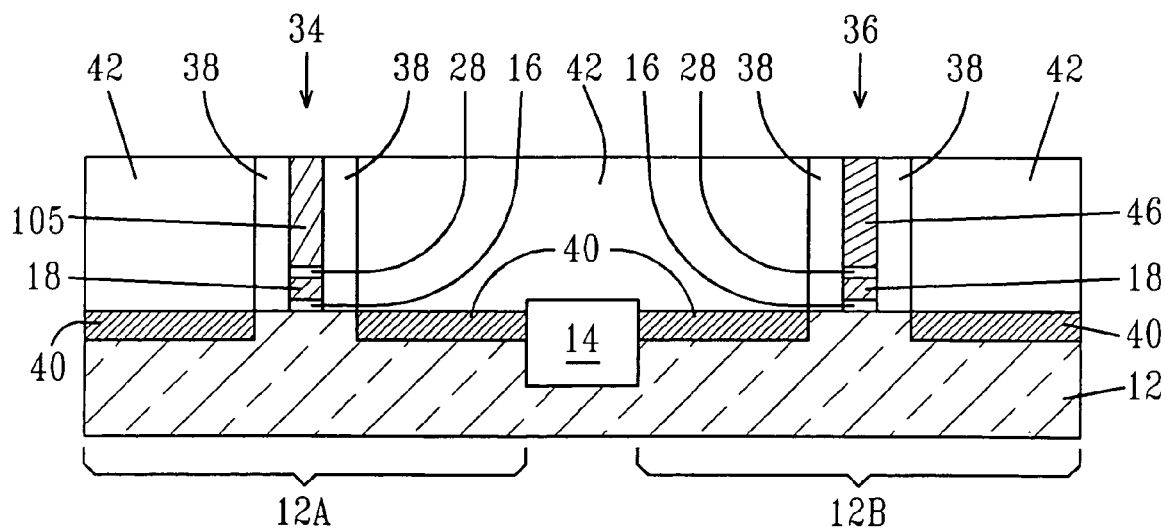

A dielectric film 42 is then formed via deposition and planarized to provide the structure shown in FIG. 2D. The deposition and planarization used in this embodiment of the present invention are the same as described above in regard to forming the structure shown in FIG. 1G.

A block mask (not shown) is then formed over the region in which the PFET is located, e.g., 12A for instance, and the second gate electrode layer 105 is removed from the region in which the NFET will be formed utilizing an etching process that selectively removes the second gate electrode layer 105 as compared with dielectric material. For example, $H_2O_2$:$H_2SO_4$ can be used to selectively etch the second gate electrode layer 105 from the region in which the NFET will be subsequently formed. The selective etch stop on the upper surface of the barrier layer 28.

A compressive metal 46 is then formed on the structure shown in FIG. 2D including the block mask and thereafter the structure is planarized to fill the patterned gate stack 36 in which the second gate electrode layer 105 was previously removed. The planarization process also removes the block mask from the structure. The resultant structure is shown, for example, in FIG. 2E.

The resultant semiconductor structure formed thus comprises at least one NFET 36 and at least one PFET 34 on a surface of a semiconductor substrate 12, wherein said at least one NFET 36 has a gate stack structure comprising a gate dielectric 16, a first gate conductor layer 18, a barrier layer 28, a compressive metal 46, and said at least one PFET 34 has a gate stack structure comprising a gate dielectric 16, a first gate electrode layer 18, a barrier layer 28 and a tensile metal or a silicide, e.g., second gate electrode layer 105. The remaining second gate electrode layer 105 including the tensile metal or silicide produces local mechanical stress in the channel of the PFET device which enhances the carrier mobility of that device, while the compressive metal 46 provides local mechanical stress on the channel of the NFET.

In either embodiment described above, the tensile or compressive metal typically provides a local mechanical gate stress in the channel of the PFET or NFET from about 0.2 to about 2 GPa, with a gate stress from about 0.5 to about 1 GPa being even more typical. The silicide metal in the PFET provides a stress from about 0.5 to about 2 GPa, with a gate stress from about 0.6 to about 1.6 GPa being more typical.

Figure 3:
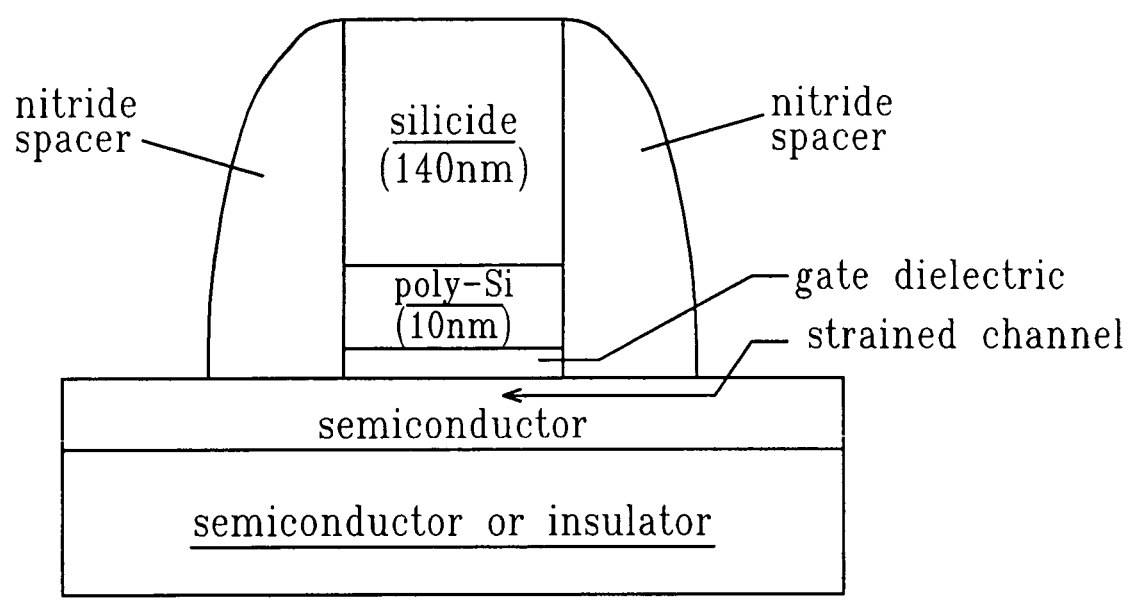
FIG. 3 represents a structure simulated with $L_{poly}$=60 nm.
Figure 4:
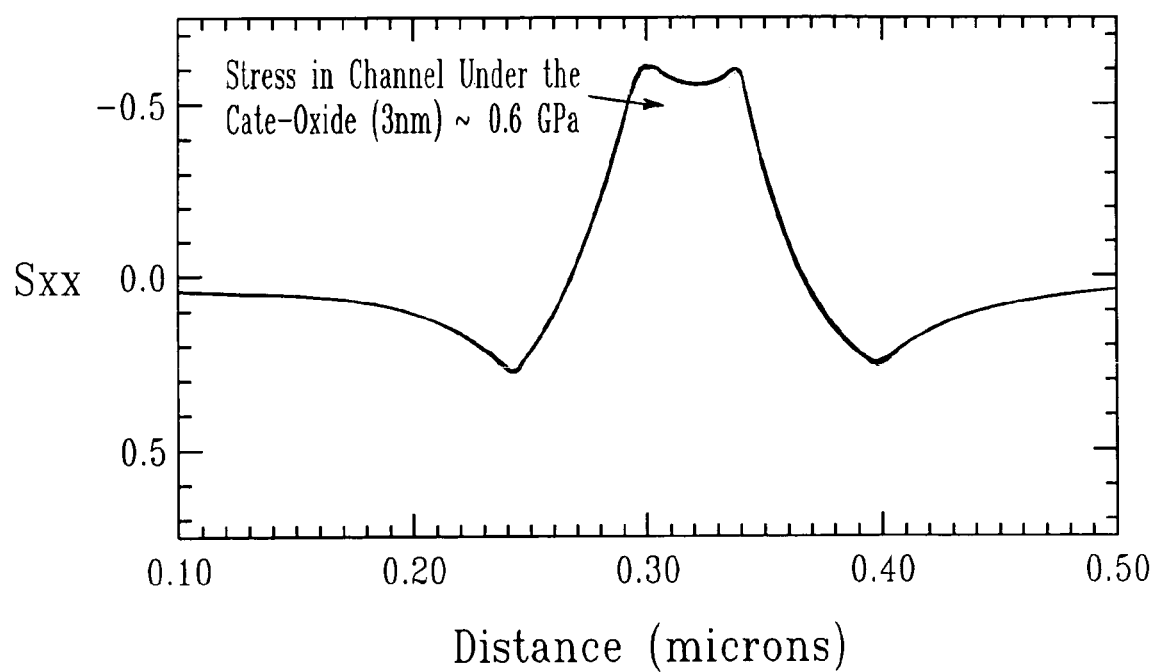
FIG. 4 is the resultant stress curve for the structure illustrated in FIG. 3 showing 0.6 GPa stress in the channel region from a tensile silicide of 2 GPa.

FIG. 3 is a pictorial representation through a cross sectional view showing a structure simulated for $L_{poly}$=60 nm. FIG. 4 is the resultant stress curve for the structure illustrated in FIG. 3 showing 0.6 GPa stress in the channel region from a tensile silicide of 2 GPa.

Figure 5:
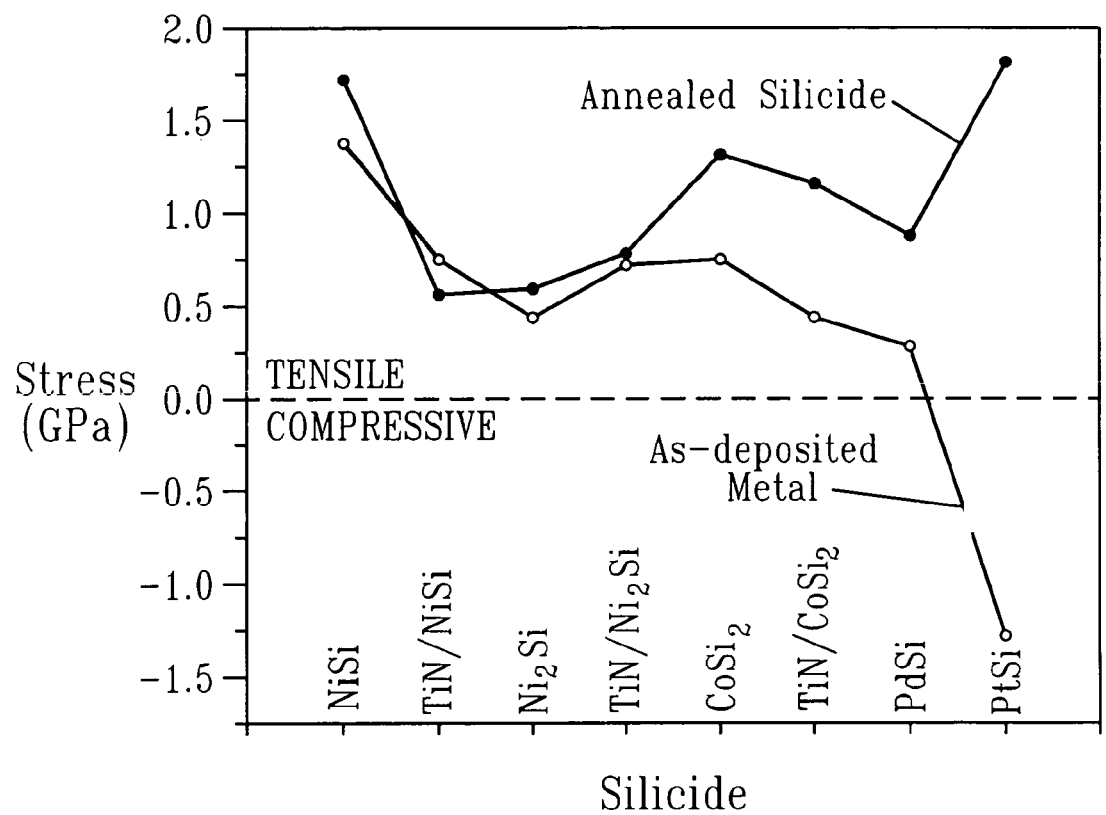
FIG. 5 is a plot of stress vs. silicide-type showing the tensile stress in various silicides after formation (0.5–2.0 GPa). Also shown is the initial as-deposited stress of the silicide metal before formation.

FIG. 5 is a plot of stress vs. silicide-type showing the tensile stress in various silicides after formation (0.5–2.0 GPa). Also shown is the initial as-deposited stress of the silicide metal before formation. In the drawing, the unfilled squares represent as deposited metal, while the filled squares denote metal after annealing, i.e., silicidation.

Figure 7:
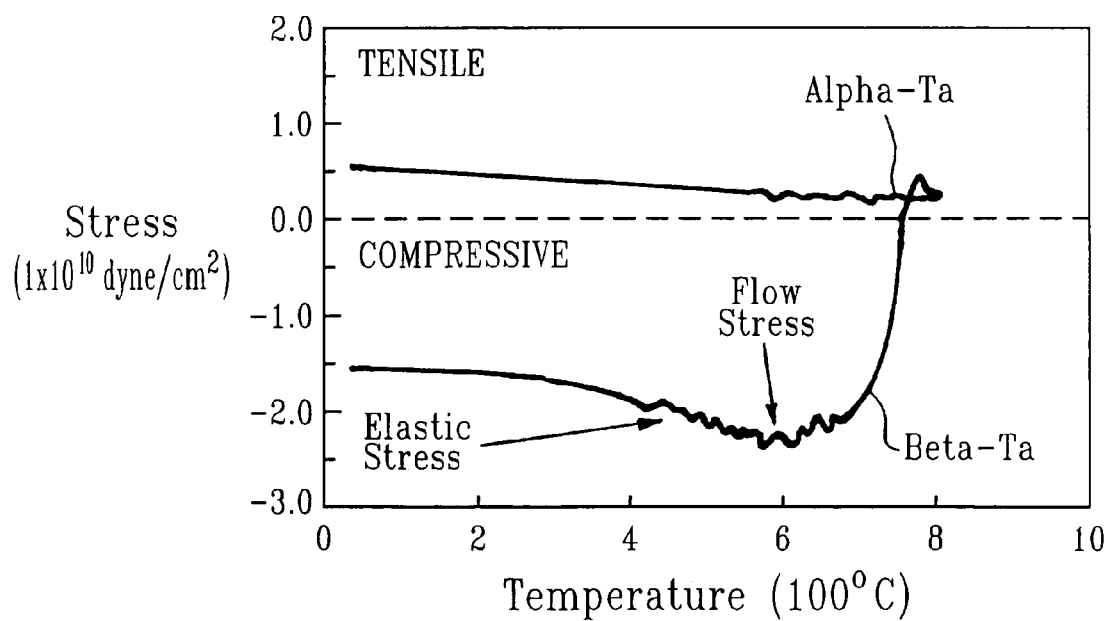
FIG. 7 is a prior art plot reproduced from J. Appl. Phys. 72(10), 4918 (1992) showing the stress in a compressive Ta film as a function of anneal temperature.

FIG. 6 is a prior art plot reproduced from J. Appl. Phys. 72(10), 4918 (1992) showing the stress in an initially stressed Ta film as a function of deposition pressure. FIG. 7 is a prior art plot reproduced from J. Appl. Phys. 72(10), 4918 (1992) showing the stress in a compressive Ta film as a function of anneal temperature.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising at least one NFET and at least one PFET on a surface of a semiconductor substrate, wherein said at least one NFET has a gate stack structure comprising, from bottom to top, a gate dielectric, a first gate electrode layer, a barrier layer, and a compressive metal that provides compressive strain to an underlying channel region of said at least one NFET, and said at least one PFET has a gate stack structure comprising, from bottom to top, a gate dielectric, a first gate electrode layer, a barrier layer and a tensile metal or a silicide, said tensile metal or silicide provides tensile strain to an underlying channel region of said at least one PFET.

2. The semiconductor structure of claim 1 wherein said semiconductor substrate comprises Si, Ge, SiGe, SiC, SiGeC, Ga, GaAs, InAs, InP, Si/SiGe, a silicon-on-insulator (SOI) or a silicon germanium-on-insulator.

3. The semiconductor structure of claim 1 wherein a trench isolation region separates said at least one NFET from said at least one PFET, said trench isolation region is located in said semiconductor substrate.

4. The semiconductor structure of claim 1 wherein said gate dielectric comprises an oxide, nitride, oxynitride, silicate or combinations and multilayers thereof.

5. The semiconductor structure of claim 1 wherein said first gate electrode layer comprises polysilicon, a conductive metal, an alloy containing at least one conductive metal, a conductive silicide, a conductive nitride, polySiGe or combinations and multilayers thereof.

6. The semiconductor structure of claim 1 wherein a portion of the first gate electrode layer is doped with a first conductivity type dopant and another portion of the first gate conductor layer is doped with a second conductivity type dopant, wherein said first conductivity type dopant is different than the second conductivity type dopant.

7. The semiconductor structure of claim 1 wherein said barrier layer comprises one of WN, TaN, TiN or TaSiN.

8. The semiconductor structure of claim 1 further comprising a second Si-containing second gate electrode layer comprises one of polysilicon or polySiGe located atop said barrier layer within said at least one PFET.

9. The semiconductor structure of claim 1 wherein said tensile metal comprises one of W, Ta, Mo, Nb, V, Pt, Ru, Re or Rh.

10. The semiconductor structure of claim 1 wherein said silicide is a metal silicide comprising one of Ti, Ta, W, Co, Ni, Pt or Pd or alloys thereof.

11. The semiconductor structure of claim 1 further comprising a dielectric film having conductive filled vias that extend to at least silicided source/drain regions that are located in said semiconductor substrate.

* * * * *